United States Patent
Luz et al.

(10) Patent No.: US 7,965,990 B2
(45) Date of Patent: Jun. 21, 2011

(54) WIRELESS BACKHAUL POWER AMPLIFICATION USING FOURIER TRANSFORM MATRICIES

(75) Inventors: Yuda Yehuda Luz, Buffalo Grove, IL (US); Jiangnan Jason Chen, Hawthorn Woods, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 642 days.

(21) Appl. No.: 11/951,445

(22) Filed: Dec. 6, 2007

(65) Prior Publication Data

US 2009/0149144 A1 Jun. 11, 2009

(51) Int. Cl.
*H04B 1/02* (2006.01)
*H04K 3/00* (2006.01)

(52) U.S. Cl. ............ 455/103; 455/127.3; 330/126; 333/109

(58) Field of Classification Search .......... 455/103, 455/127.3; 330/126; 333/109, 113, 116
See application file for complete search history.

(56) References Cited

U.S. PATENT DOCUMENTS

| | | | |
|---|---|---|---|
| 5,159,298 A * | 10/1992 | Dydyk | 333/112 |
| 5,604,462 A | 2/1997 | Gans et al. | |
| 5,764,104 A | 6/1998 | Luz | |
| 5,783,969 A | 7/1998 | Luz | |
| 5,825,762 A | 10/1998 | Kamin, Jr. et al. | |
| 6,381,212 B1 | 4/2002 | Larkin | |
| 6,639,463 B1 * | 10/2003 | Ghanadan et al. | 330/124 R |
| 7,139,539 B2 * | 11/2006 | Chun | 455/127.1 |
| 2003/0214355 A1 | 11/2003 | Luz et al. | |
| 2007/0222512 A1 * | 9/2007 | Krishnamurthy et al. | 330/149 |

* cited by examiner

*Primary Examiner* — Lee Nguyen

(57) ABSTRACT

An apparatus amplifies RF signals in a communication system by using a first directional coupler having at least two inputs and at least two outputs; at least two RF amplifiers, where an input of each RF amplifier is connected to a different one of the at least two outputs of the first directional coupler; and a second directional coupler having at least two inputs and at least two outputs, where each one of the at least two inputs is connected to an output of a different one of the at least two RF amplifiers. The at least two outputs of the second directional coupler are connected to at least two antennas, respectively.

13 Claims, 7 Drawing Sheets

600

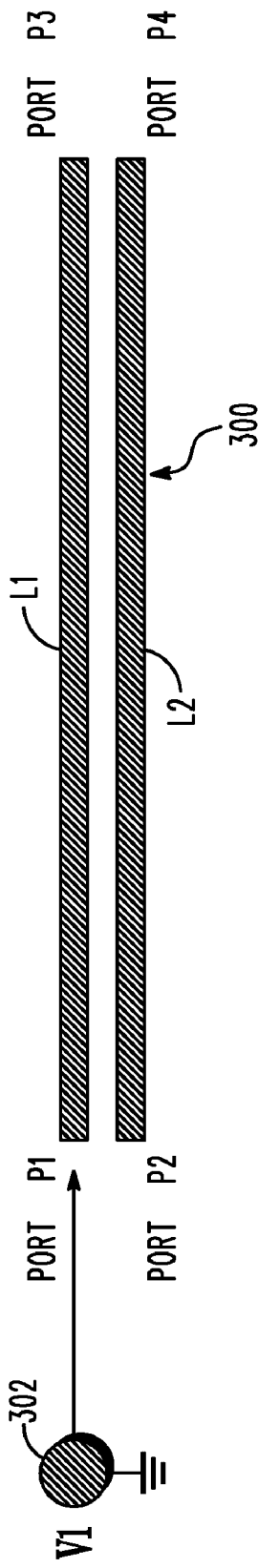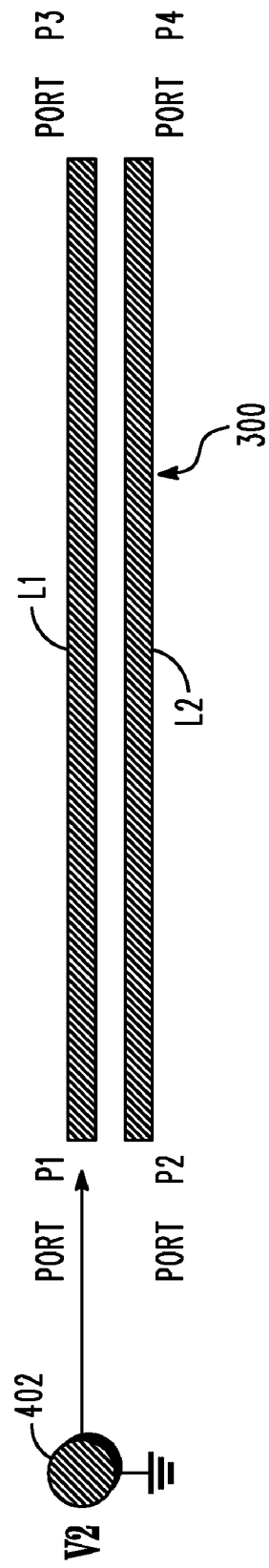

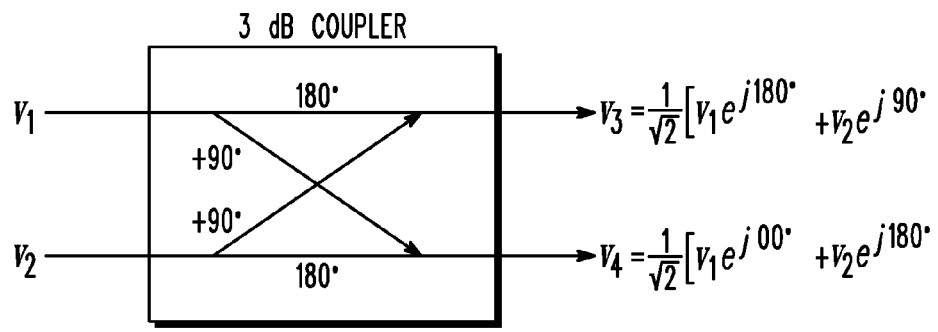
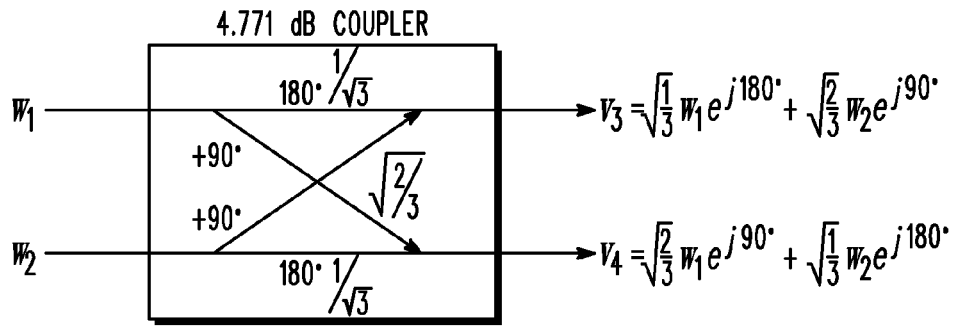
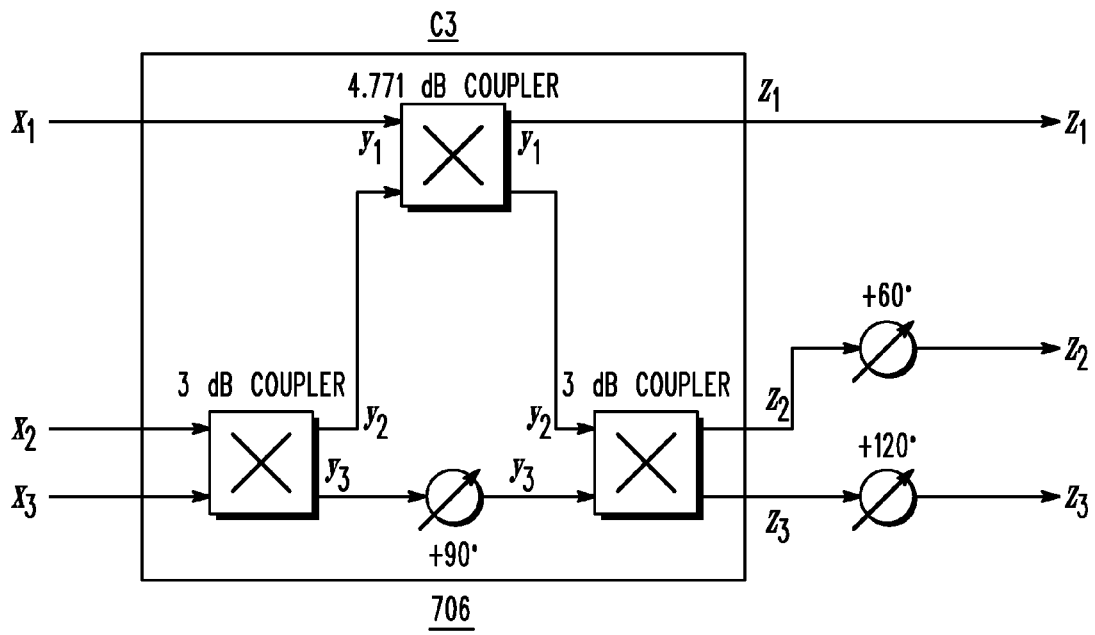
FIG. 7

$$\begin{pmatrix} V_3 \\ V_4 \end{pmatrix} = \frac{1}{\sqrt{2}} \begin{pmatrix} -1 & j \\ j & -1 \end{pmatrix} \begin{pmatrix} V_1 \\ V_2 \end{pmatrix} \triangleq A \begin{pmatrix} V_1 \\ V_2 \end{pmatrix} \quad (1)$$

WHERE $j = \sqrt{-1}$ $$A*A = \frac{1}{2} \begin{pmatrix} -1 & j \\ j & -1 \end{pmatrix} * \begin{pmatrix} -1 & j \\ j & -1 \end{pmatrix} = \begin{pmatrix} 0 & -j \\ -j & 0 \end{pmatrix} = (-j) \begin{pmatrix} 0 & 1 \\ 1 & 0 \end{pmatrix} \quad (2)$$

WHERE $(-j)$ IS SIMPLY A PHASE SHIFT OF $-90°$ $$\begin{pmatrix} Z_1 \\ Z_2 \\ Z_3 \end{pmatrix} = \frac{1}{\sqrt{3}} \begin{pmatrix} e^{j180°} & e^{-j90°} & e^{j180°} \\ e^{-j30°} & e^{-j60°} & e^{j90°} \\ e^{-j60°} & e^{j150°} & e^{j180°} \end{pmatrix} \begin{pmatrix} X_1 \\ X_2 \\ X_3 \end{pmatrix} = B \begin{pmatrix} X_1 \\ X_2 \\ X_3 \end{pmatrix} \quad (3)$$

$$B*B = \frac{1}{3} \begin{pmatrix} e^{j180°} & e^{j-90°} & e^{j180°} \\ e^{-j30°} & e^{-j60°} & e^{j90°} \\ e^{-j60°} & e^{j150°} & e^{j180°} \end{pmatrix} * \begin{pmatrix} e^{j180°} & e^{j-90°} & e^{j180°} \\ e^{-j30°} & e^{-j60°} & e^{j90°} \\ e^{-j60°} & e^{j150°} & e^{j180°} \end{pmatrix}$$

$$= \begin{pmatrix} 0 & 0 & -1 \\ 0 & e^{-j120°} & 0 \\ e^{j120°} & 0 & 0 \end{pmatrix} \quad (4)$$

WIRELESS BACKHAUL POWER AMPLIFICATION USING FOURIER TRANSFORM MATRICIES

FIELD OF THE INVENTION

The present invention generally relates to the field of wireless communications, and more particularly relates to amplification of wireless backhaul transmissions in wireless communication systems.

BACKGROUND OF THE INVENTION

Base transceiver stations (BTS) are deployed in wireless telecommunications networks to serve as the interface between mobile subscribers and the network infrastructure facilitating communication capabilities. Each BTS wirelessly transmits information to the subscriber units and also wirelessly receives information from the subscriber units.

BTSs transmit and receive in a generally omni-directional radiation pattern. The area served by this pattern is called a "cell," with the BTS being located at the center of the cell. This is shown in FIG. 1, where a cell 101 is served by BTS 108. By providing adjacent cells 102-107, each with its own respective BTS, 110-115, mobile subscriber devices 116a-n can move freely from one cell to another. As the subscriber devices 116a-n move from one cell, i.e., geographic area, to another, the system provides a mechanism for switching control of the subscriber devices 116a-n from one BTS to another. More specifically, a subscriber device 116 is handled by a particular BTS when the subscriber device 116 is within the geographic region serviced by the BTS and then handed over to a neighbor BTS as the subscriber unit moves to the neighbor BTS's cell, all without dropping an active call.

The term "backhauling," as used in a telecommunications context, is used to describe the process of transporting traffic between a BTS and the rest of the network 120, such as, for example, to communicate traffic to the internet. In most wireless systems in use today, each BTS has a wired connection to the rest of the network 120. However, there still remain many BTSs without a hard connection. These BTSs must perform backhauling by wirelessly transmitting information to neighbor BTSs, who either send the information to the core network 120 or must transmit the information to further neighbors if they themselves also do not have hard connections to the rest of the network.

As can be seen in FIG. 1, a BTS 108 serves a cell 101, with a maximum transmission range R, which is the radius of the cell 101. All subscriber units 116a-n will receive coverage from BTS 108 inside of this cell 101. To facilitate transmission to the subscriber units 116a-n within the cell 101 and to other BTS's for backhauling, each BTS is equipped with a power amplifier (PA) 118. If the power required to transmit a signal a distance R is equal to P1, it then follows that a transmission power of at least 4×P1 (+6 dB) is required for a BTS 108 to transmit a distance N=2R to a neighbor BTS 114 for backhauling. This requires a larger power size PA 118 for backhauling transmission compared with the regular access transmission within the cell. As the backhaul direction is not moving, one obvious solution is to replace the backhaul antenna with a high directivity antenna, which can provide higher antenna gain of 18 dB or even more, and may reach higher range of distance. However, those antennas are very expensive, and the higher the directivity the higher the size and the weight and the cost.

It is impractical to install two PAs, one for inter-cell transmissions and a separate, higher-powered PA for backhauling into each BTS. It is also inefficient to install a PA with higher power than is needed to serve a particular cell. Generally speaking, the higher the power rating, the more expensive a PA is to purchase and use. Additionally, once the BTS is given a wired link into the network, and wireless backhauling in no longer necessary, the PA will be at least twice the needed power rating.

Therefore a need exists to overcome the problems with the prior art as discussed above.

SUMMARY OF THE INVENTION

According to one embodiment of the present invention, an apparatus amplifies RF signals in a communication system by using a first directional coupler having at least two inputs and at least two outputs; at least two amplifiers, where an input of each amplifier is coupled to a different one of the at least two outputs of the first directional coupler; and a second directional coupler having at least two inputs and at least two outputs, where each one of the at least two inputs is coupled to an output of a different one of the at least two amplifiers.

Optionally, each of a set of antennas is coupled to a different one of the at least two outputs of the second directional coupler.

According to one embodiment, a first signal source is applied to a first of the at least two first directional coupler inputs; and a second signal source is applied to a second of the at least two first directional coupler inputs, and wherein the first and second signal sources apply corresponding first and second signals to the first directional coupler in one of a time division duplex scheme and a frequency division duplex scheme.

According to one implementation, a digital signal processor comprising first and second digital signal outputs is coupled via each of its outputs to an input of first and second digital to analog converters, respectively. First and second RF converters are electrically coupled with the output of the first and second digital to analog converters, respectively. The output of the first RF converter is applied to the first input of the first directional coupler, and the output of the second RF converter is applied to the second input of the first directional coupler. The first and second RF converters apply corresponding first and second RF signals to the first directional coupler in at least one of a time division duplex scheme and a frequency division duplex scheme.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention.

FIG. 3 is a block diagram illustrating an example of a 4-port directional coupler with a first signal source, according to one embodiment of the present invention;

FIG. 4 is a block diagram illustrating the 4-port directional coupler of FIG. 3 with a second signal source;

FIG. 7 is a schematic diagram of the directional coupler of the amplifier circuit of FIG. 6, according to one embodiment of the present invention.

FIG. 8 is a list of four equations for demonstrating vectors used in transferring power signals through a coupler circuit suitable for use with the 3-input/3-output amplifier circuit of FIG. 6.

DETAILED DESCRIPTION

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

The presently claimed invention, according to an embodiment, overcomes problems with the prior art by optimizing the hardware responsible for wireless communication of information to wireless communication devices and infrastructure. An embodiment of the present invention increases hardware utilization in wireless systems by providing a base transceiver station (BTS) power amplifier (PA) sharing solution between backhaul and access data by using Fourier Transform matrices that can substantially double backhaul RF power in a standard BTS PA arrangement.

The term wireless communication device is intended to broadly cover many different types of devices that can wirelessly receive signals, and optionally can wirelessly transmit signals, and may also operate in a wireless communication system. For example, and not for any limitation, a wireless communication device can include any one or a combination of the following: a cellular telephone, a mobile phone, a smartphone, a two-way radio, a two-way pager, a wireless messaging device, a laptop/computer, a PDA, an automotive gateway, a residential gateway, and the like.

Example of a Wireless Communications System

Figure 1:
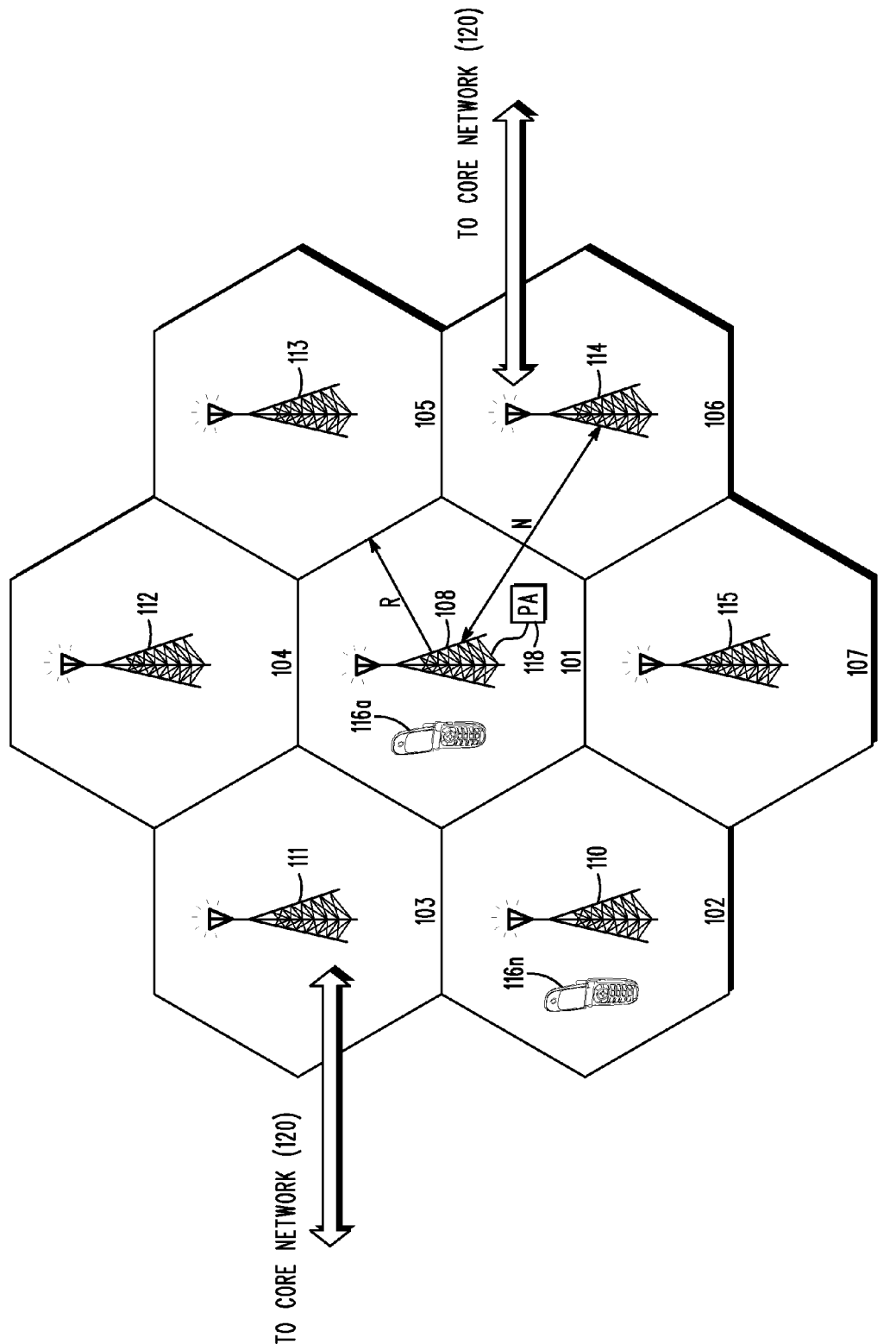
FIG. 1 is block diagram illustrating an example of a wireless communications system, according to one embodiment of the present invention.

According to an embodiment of the present invention, as shown in FIG. 1, exemplary wireless communication devices 116*a-n* are illustrated communicatively coupled to a network 100. The wireless communications network 100 connects wireless communication devices 116*a-n* to a core network 120. The wireless communications network 100 comprises a mobile phone network, a mobile text messaging device network, a pager network, or the like. Furthermore, the communications standard of the communications network 100 of FIG. 1, according to the present example, comprises Code Division Multiple Access (CDMA), Time Division Multiple Access (TDMA), Global System for Mobile Communications (GSM), General Packet Radio Service (GPRS), Frequency Division Multiple Access (FDMA), Orthogonal Frequency Division Multiplexing (OFDM), WiMax 802.16e, 3GSM Long Term Evolution (LTE). Additionally, the wireless communications network 201 comprises text messaging standards, for example, Short Message Service (SMS), Enhanced Messaging Service (EMS), Multimedia Messaging Service (MMS), or the like; and allows for push-to-talk over cellular communications between capable wireless communication devices.

The wireless network 100 supports any number of wireless communication devices 116*a-n*. The support of the wireless network 100 includes support for mobile telephones, smart phones, text messaging devices, handheld computers, pagers, beepers, or the like. A smart phone is a combination of 1) a pocket PC, handheld PC, palm top PC, or Personal Digital Assistant (PDA), and 2) a mobile telephone. More generally, a smartphone can be a mobile telephone that has additional application processing capabilities.

"Duplex" communication systems are those in which a signal can flow in both directions between connected parties. These systems are employed in nearly all communications networks, either to allow for a "two-way street" between connected parties or to provide a "reverse path" for the monitoring and remote adjustment of equipment in the field.

In one embodiment, the communications network 100 is capable of broadband wireless communications utilizing time division duplexing ("TDD"). The TDD duplexing scheme allows for bi-directional transmission of signals using a single frequency. TDD is flexible with regard to allocation of timeslots for forward and reverse, making it well suited for asymmetrical applications. It should be noted that the present invention is not limited to an 802.16e system for implementing TDD. Other standards are also applicable.

In another embodiment, the communications network 100 is capable of broadband wireless communications utilizing frequency division duplexing ("FDD"). FDD is the application of frequency-division duplexing, and/or multiplexing, to separate outward and return signals. The uplink and downlink sub-bands are said to be separated by the "frequency offset". Frequency division duplex is much more efficient in the case of symmetric traffic.

The communication network 100, the core network 120, and the wireless communication devices 116*a-n* together comprise a wireless communication system. The wireless communications system is not limited to a system using only FDD and TDD schemes. For example, TDD may be used for only a portion of the available communication channels in the communication system, while one or more schemes are used for the remaining communication channels.

Base Transceiver Stations

The network 100 includes a group of BTS, 108-115 that each has a dedicated connection to a subset of the other BTSs, 108-115. Each BTS, 108-115, serves a cell, 101-107, respectively, and provides shared access to subscriber devices 116*a-n* (both Uplink, i.e., from the devices 116*a-n* to the core network 120, and Downlink, i.e., from the core network 120 to the devices 116*a-n*) when the devices 116*a-n* are within range of one of the BTSs 108-115.

The BTSs 108-115 are connected in a mesh network topology through wired or wireless links to route the traffic to/from the core network 120. A "Gateway" BTS is a BTS that serves dual purposes: 1. the standard function of providing access to subscribers 116 it covers; and 2. to serve as ingress and egress points to the core network 120. A "Transit" BTS is a BTS that: 1. provides access service to subscribers in its coverage area;

and 2. serves as a transit node for forwarding traffic to subscribers 116 that are served by other access points.

Figure 2:
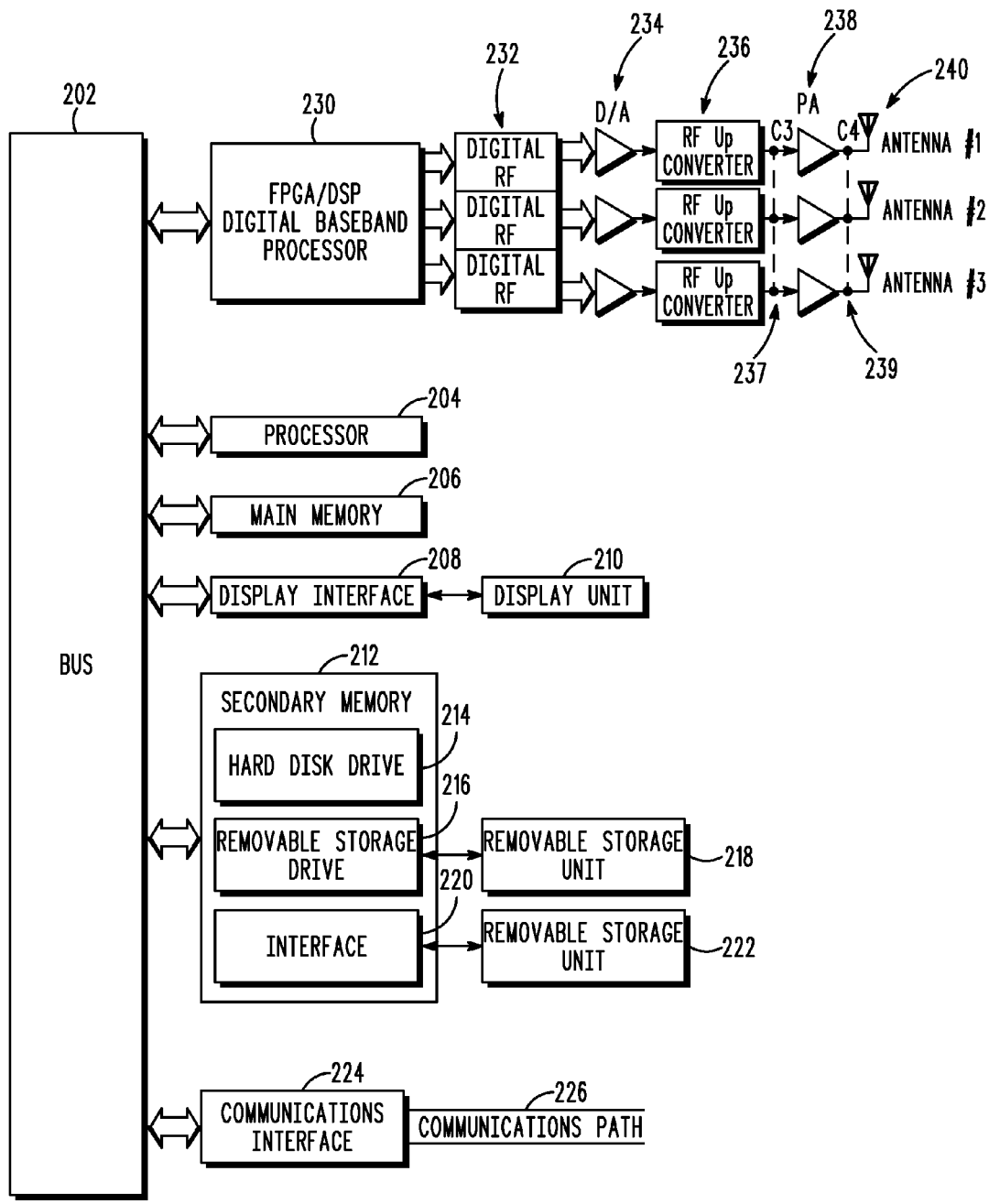
FIG. 2 is a block diagram illustrating a more detailed view of an example of an information processing system and communication system, according to one embodiment of the present invention.

FIG. 2 is a high level block diagram illustrating a more detailed view of one example of a processing and communication system utilized with a BTS according to one embodiment of the present invention. The system 200, in one embodiment, resides outside of and is communicatively coupled to its respective BTS. In another embodiment, the system 200 resides within its respective BTS. The information processing system 200 is based upon a suitably configured processing system adapted to implement the exemplary embodiment of the present invention. For example, a personal computer, workstation, or the like, may be used.

In one embodiment of the present invention, the computer system 200 includes one or more processors, such as processor 204. The processor 204 is connected to a communication infrastructure 202 (e.g., a communications bus, cross-over bar, or network). Various software embodiments are described in terms of this exemplary computer system. After reading this description, it will become apparent to a person of ordinary skill in the relevant art(s) how to implement the invention using other computer systems and/or computer architectures.

The computer system 200 can include a display interface 208 that forwards graphics, text, and other data from the communication infrastructure 202 (or from a frame buffer) for display on the display unit 210. The computer system also includes a main memory 206, preferably random access memory (RAM), and may also include a secondary memory 212 having components such as a hard disk drive 214 and/or a removable storage drive 216 representing a floppy disk drive, a magnetic tape drive, an optical disk drive, etc. The removable storage drive 216 reads from and/or writes to a removable storage unit 218 in a manner well known to those having ordinary skill in the art. Removable storage unit 218, represents a floppy disk, a compact disc, magnetic tape, optical disk, etc. which is read by and written to by removable storage drive 216. As will be appreciated by one of ordinary skill in the art, the removable storage unit 218 includes a computer readable medium having stored therein computer software and/or data. The computer readable medium may include non-volatile memory, such as ROM, Flash memory, Disk drive memory, CD-ROM, and other permanent storage. Additionally, a computer medium may include, for example, volatile storage such as RAM, buffers, cache memory, and network circuits. Furthermore, the computer readable medium may comprise computer readable information in a transitory state medium such as a network link and/or a network interface, including a wired network or a wireless network that allow a computer to read such computer-readable information.

In alternative embodiments, the secondary memory 212 may include other similar means for allowing computer programs or other instructions to be loaded into the computer system as commonly known in the art. Such means may include, for example, a removable storage unit 222 and an interface 220. Examples of such may include a program cartridge and cartridge interface (such as that found in video game devices), a removable memory chip (such as an EPROM, or PROM) and associated socket, and other removable storage units 222 and interfaces 220 which allow software and data to be transferred from the removable storage unit 222 to the computer system.

The computer system, in this example, includes a communications interface 224 that allows software and data to be transferred between the computer system and external devices or access points via a communications path 226. Examples of communications interface 224 may include a modem, a network interface (such as an Ethernet card), a communications port, a PCMCIA slot and card, etc. Software and data transferred via communications interface 224 are in the form of signals which may be, for example, electronic, electromagnetic, optical, or other signals capable of being received by communications interface 224. The signals are provided to communications interface 224 via a communications path (i.e., channel) 226. The channel 226 carries signals and may be implemented using wire or cable, fiber optics, a phone line, a cellular phone link, an RF link, and/or other communications channels. Data stored in any of the data storage areas 206, 212 of the computer system 200 can be inventoried. Therefore, the computer system 200 provides a data counter that can determine the amount of data that has arrived at the access point via communication interface 224. The communication interface 224 also acts as an input for receiving information from other access points, such as values indicating amounts of data that are scheduled to be received from the other access points and as an output for sending data to the other access points.

In this document, the terms "computer program medium," "computer usable medium," and "computer readable medium" are used to generally refer to media such as main memory 206 and secondary memory 212, removable storage drive 216, a hard disk installed in hard disk drive 214, and signals. The computer program products are means for providing software to the computer system. The computer readable medium allows the computer system to read data, instructions, messages or message packets, and other computer readable information from the computer readable medium.

A digital signal processor, FPGA/DSP 230, provides digital baseband processing to digital signals for each air interface (e.g., GSM, CDMA, LTE, etc.) supported by the system 200. This digital signal processor 230, also called a modem chip, generates transmit signals, such as in the I & Q baseband domain. While the present example shown in FIG. 2 illustrates three transmit signal paths being coupled from the FPGA/DSP 230 to three respective antennas 240, for simplicity the present discussion will refer only to a single signal path. However, the three signal path example will be discussed in more detail below with reference to FIG. 6.

These transmit signals are converted from the output of the FPGA/DSP 230 to intermediate frequency (IF) signals using a Digital RF converter 232. A digital-to-analog converted (D/A converter) converts the IF signals from digital signals to analog signals. According to the present example, a single D/A converter is used to convert the IF signals (I & Q signals) to analog signals. In certain alternative system implementations, this conversion could be done using two D/A converters (one for each I and Q signals). The RF up converter 236 brings the analog signal from an IF frequency signal into an RF frequency signal. At this point, the RF frequency signal is coupled into a coupler C3 237. This first coupler C3 237, the associated Power Amplifier (PA) 238, and a second coupler C4 239, are interconnected in a power coupling arrangement, which will be described in more detail below with reference to FIG. 6. The PA 238 takes the low power RF signal from the first coupler C3 237, and amplifies the RF signal from a low power into high power RF signal. The second coupler 239 couples the high power RF signal from the PA 238 to the antenna 240.

Note that the digital signal processor 230 can easily turn on and off the signal to any of the antennas 240, without need for high power RF switches. For example, the digital signal processor 230 can output an all zeros value signal thereby resulting in a substantially zero modulated power RF signal being coupled to the antenna 240. In another example, the digital signal processor 230 could output an alternating Ones-and-Zeros values signal that may result in a substantially zero modulated power RF signal being coupled to the antenna 240. The ability to turn ON and OFF the output power to the antenna 240 by the digital data output from digital signal processor 230 allows a new and novel design of a system 200 to avoid using expensive and failure prone high power RF switches. This advantageous property of one embodiment of the present invention will be discussed in more detail below.

Computer programs (also called computer control logic) are stored in main memory 206 and/or secondary memory 212. Computer programs may also be received via communications interface 224. Such computer programs, when executed, enable the computer system to perform the features of the present invention as discussed herein. In particular, the computer programs, when executed, enable the processor 204 to perform the features of the computer system. Accordingly, such computer programs represent controllers of the computer system.

Directional Couplers

Directional couplers are passive devices that couple part of the transmission power in a transmission line by a known amount out through another port, often by using two transmission lines in such proximity that energy passing through one is coupled to the other. As shown in FIG. 3, an exemplary directional coupler 300 has four ports, P1-P4. The first port, P1, is the input. The third port, P3, is the transmitted, or "main-line" port. The term "main line" refers to the transmission line section L1 between ports 1 and 3. Port 2, P2, is the coupled port and Port 4, P4, is the isolated port. Ports P2 and P4 are connected via transmission line L2. Often the isolated port is terminated with an internal or external matched load (typically 50 ohms). Since directional couplers are linear devices, the notations on FIG. 4 are arbitrary. In other words, any port can be the input, which will result in the directly connected port being the transmitted port, the adjacent port being the coupled port, and the diagonal port being the isolated port.

2×2 Fourier Transform Matrix

In accordance with an embodiment of the present invention, a coupler, such as coupler 300 is used to increase the output power of an amplifier. In this embodiment, ports P1 and P2 are used as inputs. The coupler power transfer characteristics of the coupler 300 will first be explained with respect to a signal V1 placed at port P1 by a signal source 302. A signal V1 placed at port P1 travels along transmission line L1 and is output at port P3. The signal V1 is also output at P4 due to inductive coupling between the two parallel transmission lines L1 and L2. However, the signals that output at ports P3 and P4 are not exact replicas of the input signal V1. First, the output at P4 will have a 90 degree phase shift from the input signal. This phase shift is a natural property of inductive coupling. Second, the power of the signals that output at ports P3 and P4 is, assuming a lossless device, half the power of the input signal V1. In actual applications, which always experience some amount of insertion loss, the output power at ports P3 and P4 will be less than half of the input power at port P1.

As a result of the above coupler power transfer characteristics, assuming a lossless coupler for ease of discussion, the signals that output at ports P3 and P4 can be written as follows, where Vx indicates the port outputting the signal and the number in parenthesis indicates the input signal V:

$$V_3 = \frac{v_1 e^{j150°}}{\sqrt{2}}$$

$$V_4 = \frac{v_1 e^{j30°}}{\sqrt{2}}$$

Next, as shown in FIG. 4, a signal V2 is input to port P2 by a signal source 402. The same power transfer coupler characteristics as described above apply to signal V2's path through the coupler 300. As a result, the signal output at each of the ports P3 and P4 is a linear combination of the two signals V1 and V2. In other words, the two signals are mixed together. The signals that output at ports P3 and P4 due only to V2 can be written as follows:

$$V_3 = \frac{v_2 e^{j90°}}{\sqrt{2}}$$

$$V_4 = \frac{v_2 e^{j180°}}{\sqrt{2}}$$

The power transfer coupler characteristics at the output of the matrix (ports P3 and P4) can be written as a super position:

$$V_3 = \frac{1}{\sqrt{2}}[v_1 e^{j180°} + v_2 e^{j90°}]$$

$$V_4 = \frac{1}{\sqrt{2}}[v_1 e^{j90°} + v_2 e^{j180°}]$$

The output signals V3 and V4 can be written as the following 2×2 matrix, $$\begin{bmatrix} V3 \\ V4 \end{bmatrix} = \begin{bmatrix} A11 & A12 \\ A21 & A22 \end{bmatrix} \begin{bmatrix} V1 \\ V2 \end{bmatrix} \quad \text{M1}$$

M1 is virtually the inverse of itself: $A\,A^{-1}=1$, where 1 represents the shifted unity matrix. However, it is more practical to use the same matrix as its inverse. We will show later that this generates an equivalent 2×2 matrix that has all zeros, and the only non zero elements are on the diagonal:

$$A*A = \begin{bmatrix} 0 & 1 \\ 1 & 0 \end{bmatrix}$$

where A is defined by:

$$A = \begin{bmatrix} \frac{e^{j180°}}{\sqrt{2}} & \frac{e^{j90°}}{\sqrt{2}} \\ \frac{e^{j90°}}{\sqrt{2}} & \frac{e^{j180°}}{\sqrt{2}} \end{bmatrix} = \frac{1}{\sqrt{2}} \begin{pmatrix} -1 & j \\ j & -1 \end{pmatrix}$$

Amplifiers

Manufacturers of network switching equipment use the term "back hauling" to mean getting data to the network backbone or core network 120. Looking again at FIG. 1, the term can be used to describe how a BTS can be used to interconnect data from a remote user to an Internet service provider and the core network 120. For instance, user 116a communicates to BTS 108. BTS 108, in this example, has no wired connection to the core network 120. Therefore, BTS 108 wirelessly transmits the backhaul information to an adjacent BTS, such as BTS 111 or 114, which does have a fixed connection to the wireless network 120. To make wireless transmission possible, each BTS is provided with a PA 118. RF PAs accept input signals and boost them to acceptable power levels for transmission to an intended target. The amount of power boost is in direct relation to the distance between the transmitter and receiver. PAs are well known in the art. According to one embodiment of the present invention, wide band power amplifiers are used to handle RF signals between the couplers such that RF signals can range across a wide band of frequencies. Such wide band power amplifiers are especially useful for FDD applications where carrier frequencies of the RF signals can vary by large frequency offset values. For example, the communications network 100 (see FIG. 1), according to one embodiment, is capable of broadband wireless communications utilizing frequency division duplexing. FDD applies frequency-division duplexing, and/or multiplexing, to separate outward and return signals. The uplink and downlink sub-bands are separated by the "frequency offset".

Figure 5:
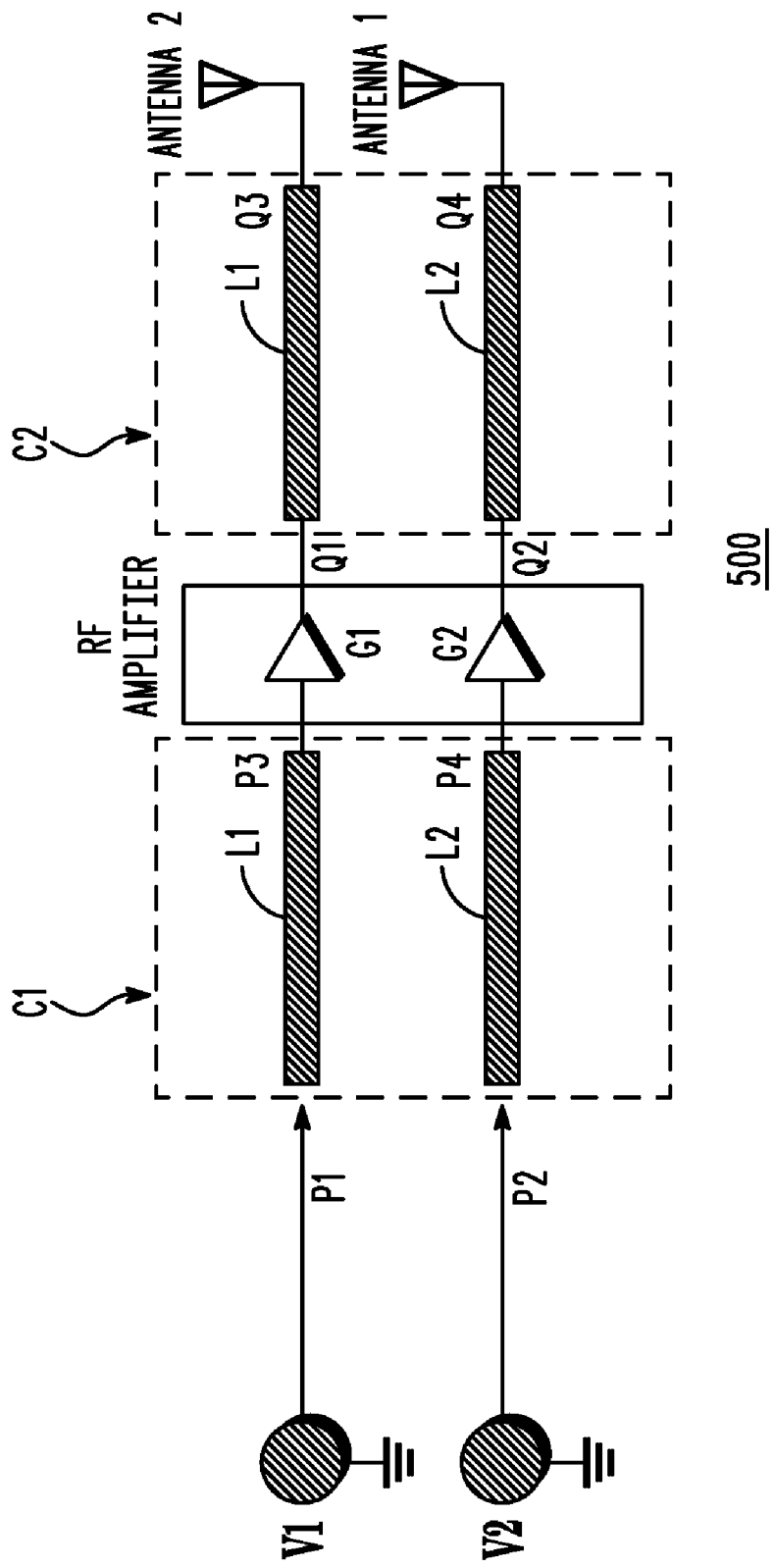
FIG. 5 is a block diagram illustrating an example of a 2-input/2-output amplifier circuit, according to one embodiment of the present invention.

Now, applying the above power transfer coupler characteristics as defined by Fourier Transform matrix principles to an amplifier circuit 500, as shown in FIG. 5, several advantages of the present invention will become clear. Looking at FIG. 5, a pair of PAs G1 and G2 is placed in a path between couplers C1 and C2. More specifically, PA G1 is provided between output port P3 of coupler C1 and input port Q1 of coupler C2. Similarly, PA G2 is provided between output port P4 of coupler C1 and input port Q2 of coupler C2.

Therefore, a signal V1, input at port P1, passes through the matrix of coupler C1, is amplified by PA G1, and passed through the matrix of coupler C2. Similarly, a signal V2, input at port P2, goes through the matrix of coupler C1, is amplified by PA G2, and passed through the matrix of coupler C2. Therefore, each signal is multiplied by the matrix M1 and then by M2. An equivalent matrix M1×M2=A×A=A² is shown below:

$$M1 * M2 = A * A = -J\begin{bmatrix} 0 & 1 \\ 1 & 0 \end{bmatrix}$$

Matrix M1 shows that PA G1 sees both signal V1 and V2 and PA G2 sees both signal V1 and V2. However, after matrix M2 we show that a signal V1 input at port P1 is output only on antenna 1 and not on antenna 2. A signal V2 input at port P2 is output only on antenna 2 and not on antenna 1. In short, the signals are completely separated. This is an important feature of one embodiment of the present invention. According to such embodiment, this feature is true for TDD, FDD and TDM modes of communication.

TDD and TDM

Time division duplexing (TDD) is the application of time-division multiplexing (TDM) to separate outward and return signals. TDM is a type of digital multiplexing in which two or more signals or bit streams are transferred as sub-channels in one communication channel. Even though the signals appear to be transferred simultaneously, they are physically taking turns on the channel. The time domain is divided into several recurrent timeslots of fixed length, one for each sub-channel. A sample, byte or data block of sub-channel 1 is transmitted during timeslot 1, sub-channel 2 during timeslot 2, etc. One TDM frame consists of one timeslot per sub-channel. After the last sub-channel the cycle starts all over again with a new frame, starting with the second sample, byte or data block from sub-channel 1, etc.

In a TDD system according to one embodiment of the present invention, access and backhaul share the same carrier frequency and time division multiplexing (TDM) is employed to transmit backhaul data at specific time slots, while access data occupies the remaining time slots. As a result, the access traffic data path and traffic antenna are active at a certain time frame and the backhaul traffic data path and backhaul antenna are active at a subsequent time frame.

Importantly, the PAs G1 and G2 are all active at all time frames, regardless of whether access traffic or backhaul data is being communicated. Therefore, the PAs G1 and G2 are fully utilized for both access and backhaul data, but the antennas alternate without the need for any RF switches. This is a valuable feature because it avoids the expense of using RF switches. It also reduces the system defects that can be caused by conventional RF switches.

More specifically, in one embodiment of the present invention, utilizing the circuit of FIG. 5, an access signal V1 is applied at port P1 and a backhaul signal V2 is applied at port P2. If, for example, PAs G1 and G2 are each 1 Watt amplifiers, because each PA G1 and G2 is handling half the signal, the total power for access data is 2 Watts on antenna 1 and the total power for backhaul is 2 Watts on antenna 2 when each is transmitting. The result is a 3 dB power gain by using TDM, which is used to increase the range.

Figure 6:
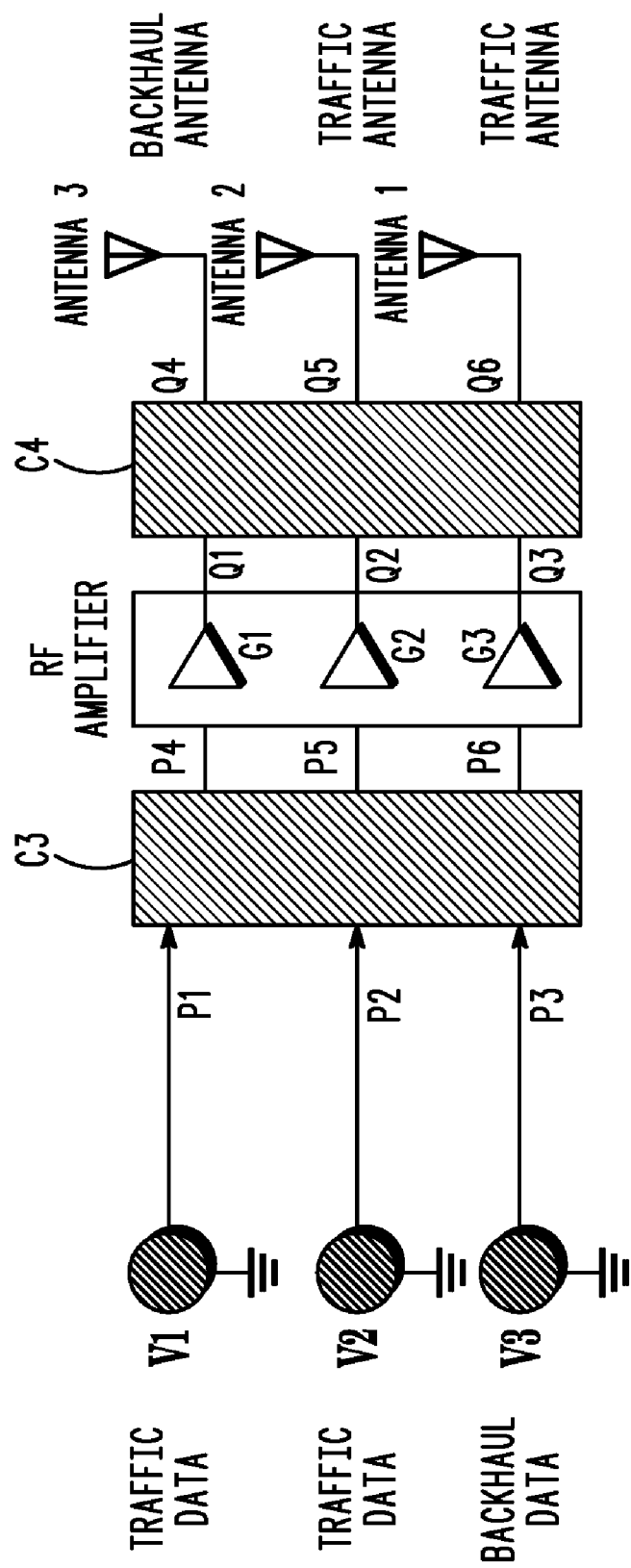
FIG. 6 is a block diagram illustrating one example of a 3-input/3-output amplifier circuit, according to one embodiment of the present invention.

FIG. 6 shows a multiple input multiple output (MIMO) application. An example of this application is also shown in FIG. 2. In a MIMO application, a BTS 108 has more than one antenna to transmit the signal and the receiver has more than one antenna to receive the signal. The circuit 600 of FIG. 6 builds on the circuit 500 of FIG. 5. Three signals, V1, V2, and V3 are input to the circuit 600, where V1 and V2 are traffic data signals and V3 is the backhaul signal. The three signals V1, V2, and V3 are input to a first coupler having power transfer coupler characteristics defined by a 3×3 Fourier Transform Matrix C3. Such a coupler defined by a 3×3 Fourier Transform Matrix is known in the art and shown in greater detail in FIG. 7. The coupler defined by the 3×3 Fourier Transform Matrix C3 includes a pair of 3 dB couplers 702 and a 4.771 dB coupler 704, also shown in FIG. 7.

The mathematical description of the 2×2 3 dB hybrid coupler 702 is indicated in FIG. 7, where the input and output relationship of a 2×2 Fourier Transform Matrix is shown in equation (1) in FIG. 8. With a pair of such 3 dB couplers, we have the input and output relationship as shown in equation (2) in FIG. 8.

The mathematical description of the 2×2 4.771 dB hybrid coupler 704 is indicated in FIG. 7. The 4.771 dB hybrid coupler 704 is also a 90 degree coupler. These two types of hybrid couplers, i.e., the 2×2 3 dB hybrid coupler 702 and the 2×2 4.771 dB hybrid 90 degree coupler 704, are used in the two 3×3 hybrid couplers C3 and C4 as shown in FIG. 6, and also as shown as C3 237 and C4 239 in the implementation example of FIG. 2. The input and output relationship of a 3×3 Fourier Transform Matrix, such as used in coupler C3 237 and coupler C4 239, is described by the 3×3 hybrid coupler 706 shown in FIG. 7. The matrix representations of these vectors for a 3×3 Fourier Transform Matrix are shown in equations (3) and (4) in FIG. 8, where the phase shifts in the matrix do not affect the power distribution of the Fourier Transform Matrix, but with different delays in the time domain.

The signal $z_x$ is therefore produced at each output port P4, P5, and P6, of the 3×3 Fourier Transform Matrix C3 (called also B below)

$$z = B \cdot x$$

$$\text{then, } B \cdot B = \begin{pmatrix} 0 & 0 & -1 \\ 0 & e^{-j120°} & 0 \\ e^{j120°} & 0 & 0 \end{pmatrix}$$

Referring now back to FIG. 6, signal V1 is input into a first port P1 of a first coupler C3; signal V2 is input into a second port P2 of the first coupler C3; and signal V3 is input into a third port P3 of the first coupler C3. The first coupler C3 has three output ports, P4, P5, and P6. Output port P4 is input to a first PA, G1; output port P5 is input to a second PA, G2; and output port P6 is input to a third PA, G3. Just as in the circuit shown in FIG. 5 and described above, the outputs of the PAs G1-G3 are input to a second coupler C4. Specifically, the output of the first PA, G1, is input to a first port, Q1, of a second coupler C4. Similarly, the output of the second PA, G2, is input to a second port, Q2, of the second coupler C4 and the output of the third PA, G3, is input to a third port, Q3, of the second coupler C4. The second coupler C4 is schematically identical to the coupler C3 shown in FIG. 7 and has three output ports, Q4, Q5, and Q6. The three output ports Q4, Q5, and Q6 are each connected to one of three antennas, Antenna 3, Antenna 2, and Antenna 1, respectively.

The circuit 600 of FIG. 6, all antennas, Antenna 3, Antenna 2, and Antenna 1 are working on the same frequency spectrum, i.e. TDM. Therefore, when Antenna 3 is collecting the backhaul, Antennas 2 and 1 are idle. Similarly, when Antenna 3 is idle, Antennas 2 and 1 are transmitting. According to an embodiment of the present invention, the signals on Antenna 1 and Antenna 2 are the same signal, but they are interleaved and completely uncorrelated at all times.

Now, for an example of the advantageous backhaul power boost provided by the circuit 600 of FIG. 6, assume a TDM scheme is used and each PA, G1, G2, and G3, has a total output power of 1 Watt. Antennas 1 and 2 will have an input power of 1.5 Watts and Antenna 3, which is the backhaul antenna, will have an input power of 3 Watts.

FDD

With the advance of PA technologies, PAs in base station nowadays are wideband PAs with bandwidth covering multiple signal bands. One embodiment of the present invention utilizes a frequency division duplex (FDD) mode for schemes with 1 or more frequencies. FDD is the application of frequency-division multiplexing to separate outward and return signals and is well know to those of average skill in the art. With FDD, the uplink and downlink sub-bands are separated by a "frequency offset".

With wideband PAs, backhaul is transmitted in a first frequency and access data is simultaneously transmitted in second frequency. Using this FDD scheme, PA power is shared for the access traffic data and PA power is also shared for the backhaul data.

Since there is more than one carrier frequency, the access data does not split the time frames for backhaul, and since the frequency is dedicated to backhaul data only, the average throughput is much higher than in the TDD mode described above.

NON-LIMITING EXAMPLES

The foregoing embodiments of the present invention are advantageous because they provide a method of increasing hardware utilization in low capacity, low budget, and less developed areas where wireline backhaul is not readily available. A cost reduction is realized by using smaller PAs while simultaneously extending backhaul distance. This configuration is more reliable than using a single PA with double the power or more, for at least the reason of providing backup for a single point of failure.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover additional applications, modifications, and embodiments within the scope of the present invention. For example, a 6×6 matrix can be constructed from 2×2 and 3×3 matrices, and similarly 9×9 and 12×12 matrices can be derived as well from those basic elements. Many different power coupling arrangements therefore can be implemented according to various embodiments of the present invention.

What is claimed is:

1. A method for amplifying signals in a communication system, the method comprising:

applying a first signal to a first input of a first directional coupler;

receiving, at a first output of the first directional coupler, a first version of the first signal reduced in power by approximately half;

receiving, at a second output of the first directional coupler, a second version of the first signal reduced in power by approximately half and differing in phase by approximately 90 degrees;

inputting the first version of the first signal to a first amplifier;

inputting the second version of the first signal to a second amplifier;

outputting an amplified version of the first version of the first signal to a first input of a second directional coupler having at least two outputs;

outputting an amplified version of the second version of the first signal to a second input of the second directional coupler; and outputting, at only a second of the at least two outputs of the second directional coupler, a version of the first signal.

2. The method according to claim 1, further comprising:

applying a second signal to a second input of the first directional coupler;

receiving, at the second output of the first directional coupler, a first version of the second signal reduced in power by approximately half;

receiving, at the first output of the first directional coupler, a second version of the second signal reduced in power by approximately half and differing in phase by approximately 90 degrees;

inputting the first version of the second signal to the second amplifier;

inputting the second version of the second signal to the first amplifier;

outputting an amplified version of the first version of the second signal to the second input of the second directional coupler;

outputting an amplified version of the second version of the second signal to the first input of the second directional coupler; and outputting, at only a first of the at least two outputs of the second directional coupler, a version of the second signal.

3. The method according to claim 1, wherein:
the first input of the first directional coupler is physically coupled to the first output of the first directional coupler by a first transmission line; and
the second input of the first directional coupler is physically coupled to the second output of the first directional coupler by a second transmission line that is proximate to the first transmission line so that a signal on the first transmission line is able to be received on the second transmission line through induction.

4. The method according to claim 1, wherein:
the first input of the second directional coupler is physically coupled to the first output of the second directional coupler by a first transmission line; and
the second input of the second directional coupler is physically coupled to the second output of the second directional coupler by a second transmission line that is proximate to the first transmission line so that a signal on the first transmission line is able to be received on the second transmission line through induction.

5. An RF power coupling arrangement suitable for use in a communication system, comprising:
a first directional coupler including:
a first input;
a first output physically coupled to the first input by a first transmission line;
a second input; and
a second output physically coupled to the second input by a second transmission line that is proximate to the first transmission line so that an RF signal on the first transmission line is received on the second transmission line through inductive coupling, and an RF signal on the second transmission line is received on the first transmission line through inductive coupling;
a first RF amplifier with an input and an output, the first output of the directional coupler being connected to the first RF amplifier's input;
a second RF amplifier with an input and an output, the second output of the directional coupler being connected to the second RF amplifier's input; and
a second directional coupler including:
a first input connected to the output of the first RF amplifier;
a first output physically coupled to the first input by a first transmission line;
a second input connected to the output of the second RF amplifier; and
a second output physically coupled to the second input by a second transmission line that is proximate to the first transmission line so that an RF signal on the first transmission line is received on the second transmission line through inductive coupling, and an RF signal on the second transmission line is received on the first transmission line through inductive coupling.

6. The RF power coupling arrangement of claim 5, further comprising:
a first antenna coupled to the first output of the second directional coupler; and
a second antenna coupled to the second output of the second directional coupler.

7. The RF power coupling arrangement of claim 5, wherein the first RF amplifier and the second RF amplifier are both wide band RF amplifiers.

8. The RF power coupling arrangement of claim 5, further including:
a digital signal processor comprising first and second digital signal outputs;
first and second digital to analog converters, each having an input and an output, the input of the first and second digital to analog converters being electrically coupled with the first and second digital signal outputs, respectively;
first and second RF converters, each having an input and an output, the input of the first and second RF converters being electrically coupled with the output of the first and second digital to analog converters, respectively; and
wherein the output of the first RF converter being applied to the first input of the first directional coupler, and the output of the second RF converter being applied to the second input of the first directional coupler, and
wherein the first and second RF converters apply corresponding first and second RF signals to the first directional coupler in at least one of a time division duplex scheme and a frequency division duplex scheme.

9. The RF power coupling arrangement of claim 8, wherein:
the first RF signal includes traffic data; and
the second RF signal includes backhaul data.

10. The RF power coupling arrangement of claim 5, further comprising:
a third input to the first directional coupler;
a third output from the first directional coupler and physically coupled to the third input to the first directional coupler by a third transmission line that is proximate to the first transmission line and the second transmission line so that an RF signal on any of the first, second, and third transmission lines is received on the other two transmission lines through inductive coupling;
a third input to the second directional coupler;
a third output from the second directional coupler and physically coupled to the third input to the second directional coupler by a third transmission line that is proximate to the first transmission line and the second transmission line so that an RF signal on any of the first, second, and third transmission lines is received on the other two transmission lines through inductive coupling; and
a third RF amplifier with an input and an output, the third output of the first directional coupler being connected to the input of the third RF amplifier and the output thereof being connected to the third input of the second directional coupler.

11. The RF power coupling arrangement of claim 10, further comprising:
a first RF signal source for applying an RF signal to the first input of the first directional coupler;
a second RF signal source for applying an RF signal to the second input of the first directional coupler; and
a third RF signal source for applying an RF signal to the third input of the first directional coupler,
wherein the first and second signal sources apply corresponding first and second RF signals that include traffic data and the third signal source applies an RF signal that includes backhaul data.

12. The RF power coupling arrangement of claim 11, wherein:
the RF signals are applied in one of a time division duplex scheme and a frequency division duplex scheme.

13. The RF power coupling arrangement of claim 5, further comprising:
a first antenna coupled to the first output of the second directional coupler;
a second antenna coupled to the second output of the second directional coupler; and
a third antenna coupled to the third output of the second directional coupler.

* * * * *